(12) United States Patent
Wright

(10) Patent No.: US 10,689,934 B2
(45) Date of Patent: *Jun. 23, 2020

(54) CHEMICAL DEEPWATER STIMULATION SYSTEMS AND METHODS

(71) Applicant: David C. Wright, The Woodlands, TX (US)

(72) Inventor: David C. Wright, The Woodlands, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/999,407

(22) Filed: Aug. 20, 2018

(65) Prior Publication Data

US 2019/0017341 A1 Jan. 17, 2019

Related U.S. Application Data

(63) Continuation of application No. 14/999,000, filed on Mar. 14, 2016, now Pat. No. 10,053,942, which is a continuation-in-part of application No. 13/694,480, filed on Dec. 5, 2012, now Pat. No. 9,284,808.

(51) Int. Cl.
*E21B 33/038* (2006.01)
*E21B 33/035* (2006.01)
*E21B 33/064* (2006.01)
*E21B 34/04* (2006.01)
(Continued)

(52) U.S. Cl.
CPC ........ *E21B 33/038* (2013.01); *E21B 33/0355* (2013.01); *E21B 33/064* (2013.01); *E21B 34/04* (2013.01); *H01L 27/1214* (2013.01); *H01L 27/1266* (2013.01); *H01L 29/78603* (2013.01); *Y10T 29/4913* (2015.01); *Y10T 29/49126* (2015.01); *Y10T 29/49128* (2015.01); *Y10T 29/49155* (2015.01)

(58) Field of Classification Search
CPC ... E21B 33/038; E21B 33/0355; E21B 33/064
USPC ........................................................ 166/373
See application file for complete search history.

(56) References Cited

U.S. PATENT DOCUMENTS

| 4,339,002 A | 7/1982 | Gibbs |
| 6,053,252 A | 4/2000 | Edwards |
| 6,663,361 B2 | 12/2003 | Kohl et al. |

(Continued)

OTHER PUBLICATIONS

Martial Burguieres, Subsea Tool Enables Deepwater Intervention, E&P Magazine, 2009.

*Primary Examiner* — Taras P Bemko
(74) *Attorney, Agent, or Firm* — Matthews, Lawson, McCutcheon & Joseph, PLLC

(57) ABSTRACT

Systems and methods for performing operations on a well include first and second flow control devices positioned between upper and lower sections of a conduit. An upper connector assembly engaged with the upper section includes connectors adapted for connection to a chemical stimulation device, a blowout preventer, or other well intervention apparatuses. A lower connector assembly engaged with the lower section includes connectors adapted for connection to a chemical stimulation device, a running tool, wellbore conduits, or other well intervention apparatuses. The two connector assemblies, above and below the flow control devices, enable sequential or simultaneous operations to be performed, and can enable operations to be performed independent of the state of the flow control devices.

19 Claims, 5 Drawing Sheets

(51) Int. Cl.
*H01L 27/12* (2006.01)
*H01L 29/786* (2006.01)

(56) References Cited

U.S. PATENT DOCUMENTS

| | | | |
|---|---|---|---|
| 6,823,942 B1 * | 11/2004 | McGee | E21B 33/068 166/379 |
| 7,225,877 B2 | 6/2007 | Yater | |
| 7,234,524 B2 | 6/2007 | Shaw et al. | |
| 7,331,394 B2 | 2/2008 | Edwards et al. | |
| 7,380,835 B2 | 6/2008 | McCoy et al. | |
| 7,934,560 B2 | 5/2011 | Roveri et al. | |
| 2002/0004014 A1 | 1/2002 | Kohl et al. | |
| 2004/0168811 A1 | 9/2004 | Shaw et al. | |
| 2006/0219412 A1 | 10/2006 | Yater | |
| 2010/0025044 A1 * | 2/2010 | McKay | E21B 33/035 166/359 |
| 2010/0301597 A1 * | 12/2010 | Morris | F16L 55/46 285/132.1 |

\* cited by examiner

CHEMICAL DEEPWATER STIMULATION SYSTEMS AND METHODS

CROSS REFERENCE TO RELATED APPLICATIONS

This application is a continuation of, and claims priority to and the benefit of, U.S. patent application Ser. No. 14/999,000, having the title of "Chemical Deepwater Stimulation Systems And Methods," filed on Mar. 14, 2016, which is a continuation-in-part of, and claims priority to and the benefit of, U.S. Pat. No. 9,284,808, having the title of "Chemical Deepwater Stimulation Systems And Methods," filed on Dec. 5, 2012.

FIELD

Embodiments usable within the scope of the present disclosure relate, generally, to systems and methods usable to perform chemical (e.g., acid) stimulation operations on a wellbore, in combination with other well intervention operations, while minimizing or eliminating the downtime normally required to remove, reposition, and/or replace equipment.

BACKGROUND

Acid stimulation is frequently used as a form of well intervention to restore production of a well to peak levels. Conventional methods for acid stimulation require use of large rigs and risers, while alternative systems can use remotely operable vehicles (ROVs), multi-service vessels (MSVs), or similar devices to access a wellhead in deep water, e.g., using coiled tubing ballasted with weight to ensure proper descent and stabilization over a working area. A significant length of conduit (e.g., 150 feet) is often necessary to ensure that the flying leads and connectors of the tubing can accommodate vessel heave and position deviation while allowing ample room for the front panel on the injection tool at the wellhead to be accessed.

When a well stimulation and/or an injection tool is engaged with a subsea well tree, other intervention operations are inhibited and/or rendered impossible, resulting in a significant downtime between well simulation and other intervention operations and necessitating the replacement and use of various equipment.

Conventional methods allow for acid injection via subsea umbilical/flying leads, e.g., through the installation of an acid tool that latches onto a tree via a tree running tool. Such methods allow for injection, but do not allow the wellbore to be accessed and/or only enable access via steel tubing and/or hosing. Thus, items having large outer diameters, such as an internal tree plug or wireline tools, cannot enter the wellbore. Essentially, wireline equipment cannot be operated within an umbilical or similar conduit due to the inherent physical constraints of the umbilical.

The limitation of equipment and methods that only permit injection of acid without having the ability to enter the well using wireline equipment contributes to operational downtime, as a separate pressure control assembly (e.g., a blowout preventer) is then needed to access the well with wireline equipment.

A need exists for systems and methods that enable both well stimulation operations and other intervention operations to be conducted, while minimizing the replacement of equipment and downtime therebetween, while maintaining at least two barrier valves to isolate the wellbore.

A further need exists for systems and methods that enable running of wireline equipment while providing at least two isolation barriers, the two or more barriers being closable to allow chemical injection to take place via placement of isolation barriers in an exterior portion (e.g., "wings") of the system.

A need also exists for systems and methods that can be operated riglessly, or alternatively using only a small hoist and/or a multi-service vessel, eliminating the need for conventional rig and riser-based installation procedures. A lubricator and/or a "greasehead" can be used to create a seal during such rigless wireline operations.

SUMMARY

Embodiments usable within the scope of the present disclosure relate to systems usable for performing operations on a well that include a conduit (e.g., a central conduit in communication with a wellbore) having an upper section and a lower section. A first flow control device, such as a barrier valve or other similar types of valves (e.g., ball valves or hydraulic valves), regulators, and/or devices usable to limit, divert, or prevent the flow of fluid, can be positioned between the upper and lower sections of the conduit. Similarly, a second flow control device can be positioned beneath (e.g., in a downhole direction) the first flow control device, between the upper and lower sections of the conduit, thereby forming a double-barrier usable to isolate the wellbore.

An upper connector assembly can be engaged with the upper section of the conduit for enabling communication therewith. The upper connector assembly can include a first flow cross member in fluid communication with the first flow control device, the first flow cross member enabling fluid flow in at least two directions. The upper connector assembly can further include a connector adapted for connection to a chemical stimulation device (e.g., an acid stimulation unit) or a similar well intervention apparatus, and a top connector, usable for engagement with a blowout preventer, and/or for performing chemical stimulation, and/or for plug and abandonment, and/or for subsea remediation, and/or other well intervention operations therethrough.

Similarly, a lower connector assembly can be engaged with the lower section of the conduit and includes a second flow cross member in fluid communication with the second flow control device, the second flow cross member enabling fluid flow in at least two directions. The lower connector assembly can include a connector adapted for connection to a chemical stimulation device or a similar well intervention apparatus, and a bottom connector adapted for engaging a running tool, a wellbore conduit, a blowout preventer, or combinations thereof.

Pump in lines can be engaged with the connectors of either or both of the upper and lower connector assemblies, to be used for chemical stimulation, connection to a tree running tool, or other intervention operations, without requiring installation of additional equipment. Thus, the upper connector assembly can be used to perform stimulation and/or other intervention operations through a pump in line and/or the top connector, through the first and second flow control devices (e.g., when the flow control devices are open to permit fluid flow and/or passage of other materials), and/or to accommodate a blowout preventer, while the lower connector assembly can be used to perform stimulation and/or other well operations independent of the first and second flow control devices (e.g., even when the barrier valves or similar flow control devices are closed). Thus, for example, the bottom section of the system could be used for well stimulation while the top section is used for other well operations, simultaneously or in combination therewith. The connectors of either or both of the upper and lower connector assemblies can include emergency quick disconnect (EQD) members to enable rapid disconnection when necessary to close the system and ensure safe operation and/or departure of any vessel.

BRIEF DESCRIPTION OF THE DRAWINGS

In the detailed description of various embodiments usable within the scope of the present disclosure, presented below, reference is made to the accompanying drawings, in which.

One or more embodiments are described below with reference to the listed Figures.

DETAILED DESCRIPTION OF THE EMBODIMENTS

Before describing selected embodiments of the present disclosure in detail, it is to be understood that the present invention is not limited to the particular embodiments described herein. The disclosure and description herein is illustrative and explanatory of one or more presently preferred embodiments and variations thereof, and it will be appreciated by those skilled in the art that various changes in the design, organization, order of operation, means of operation, equipment structures and location, methodology, and use of mechanical equivalents may be made without departing from the spirit of the invention.

As well, it should be understood that the drawings are intended to illustrate and plainly disclose presently preferred embodiments to one of skill in the art, but are not intended to be manufacturing level drawings or renditions of final products and may include simplified conceptual views as desired for easier and quicker understanding or explanation. As well, the relative size and arrangement of the components may differ from that shown and still operate within the spirit of the invention.

Moreover, it will be understood that various directions such as "upper," "lower," "bottom," "top," "left," "right," and so forth are made only with respect to explanation in conjunction with the drawings, and that the components may be oriented differently, for instance, during transportation and manufacturing as well as operation. Because many varying and different embodiments may be made within the scope of the concepts herein taught, and because many modifications may be made in the embodiments described herein, it is to be understood that the details herein are to be interpreted as illustrative and non-limiting.

Embodiments usable within the scope of the present disclosure relate to systems and methods usable to perform wellbore intervention operations (e.g., chemical stimulation, tubular running, and/or other similar operations) without requiring removal, repositioning, and/or replacement of existing equipment to perform different operations, and in an embodiment, without requiring use of a rig or similar maneuvering equipment.

Conventional methods for performing chemical stimulation operations require use of a large rig to hoist risers into place and run these risers from a large vessel to the wellbore. After a chemical stimulation operation is performed, the required equipment must be removed and replaced with other equipment for performing additional intervention operations. Embodiments usable within the scope of the present disclosure overcome these and other limitations of existing systems and methods.

Figure 1:
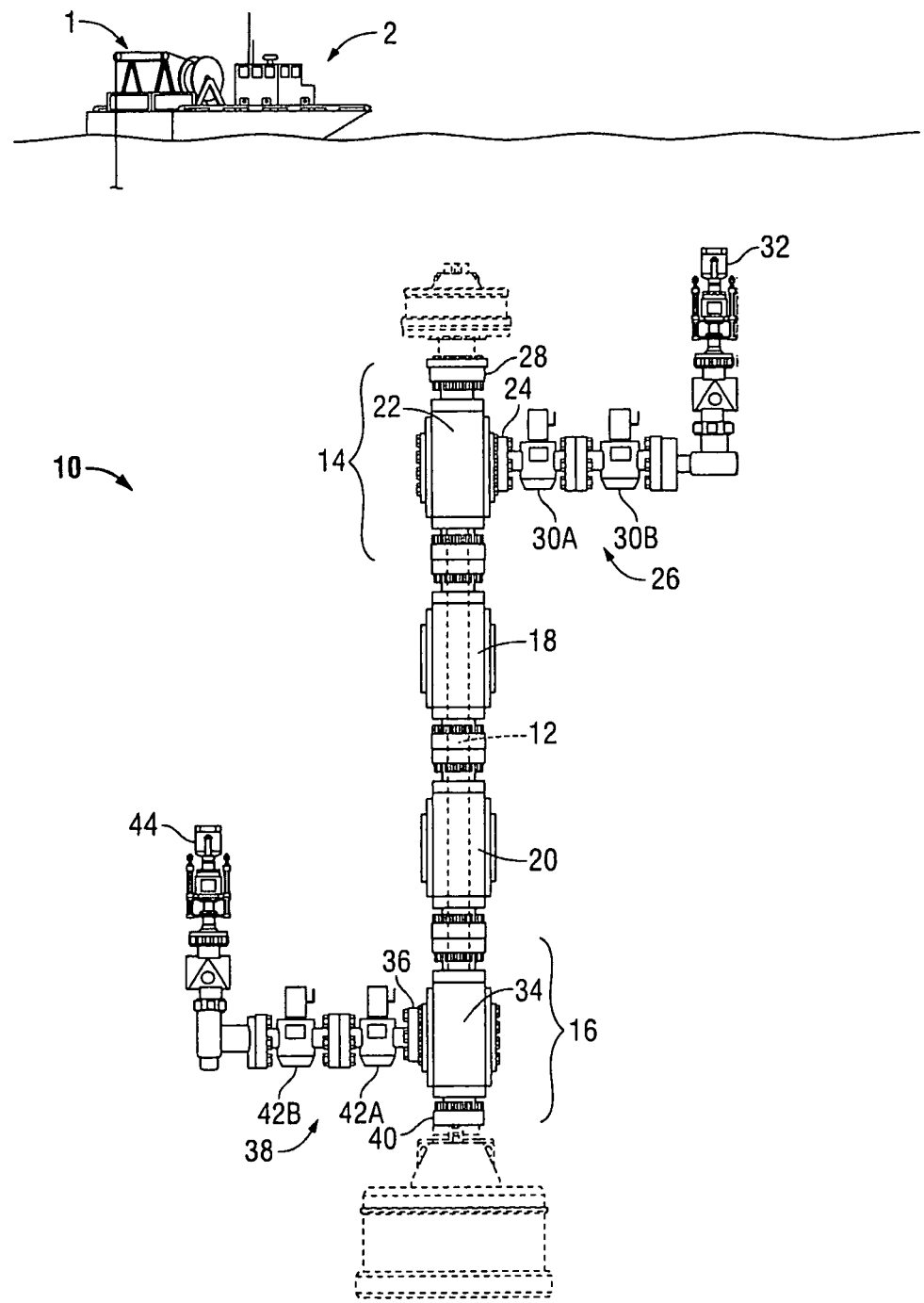
FIG. 1 depicts a diagrammatic side view of an embodiment of a system usable within the scope of the present disclosure.

Referring now to FIG. 1, a diagrammatic side view of an embodiment of a system (10) usable within the scope of the present disclosure is shown. The system (10) includes a central conduit (12) positioned above a wellbore (e.g., in an uphole direction relative to the wellbore), an additional conduit communicating with a wellbore, and/or a running tool (not shown). The central conduit (12) includes an upper section (14) and a lower section (16). It should be noted that the division of the conduit (12) into upper and lower sections (14, 16) is a conceptual division to facilitate clarity, and does not necessarily require that the conduit (12) include multiple separable members, as depicted. Embodiments usable within the scope of the present disclosure can include integral and/or unitary conduits, or conduits having any number of physical components.

As shown, a first flow control device (18) and a second flow control device (20), which can include ball valves, hydraulic valves, and/or other similar devices usable to restrict, regulate, prevent, and/or divert fluid flow, are positioned between the upper and lower sections (14, 16) of the conduit (12), enabling isolation of the upper section (14) from the lower section (16), and enabling isolation of the wellbore from the upper section (14) and/or the environment external to the conduit (12).

Figure 5:
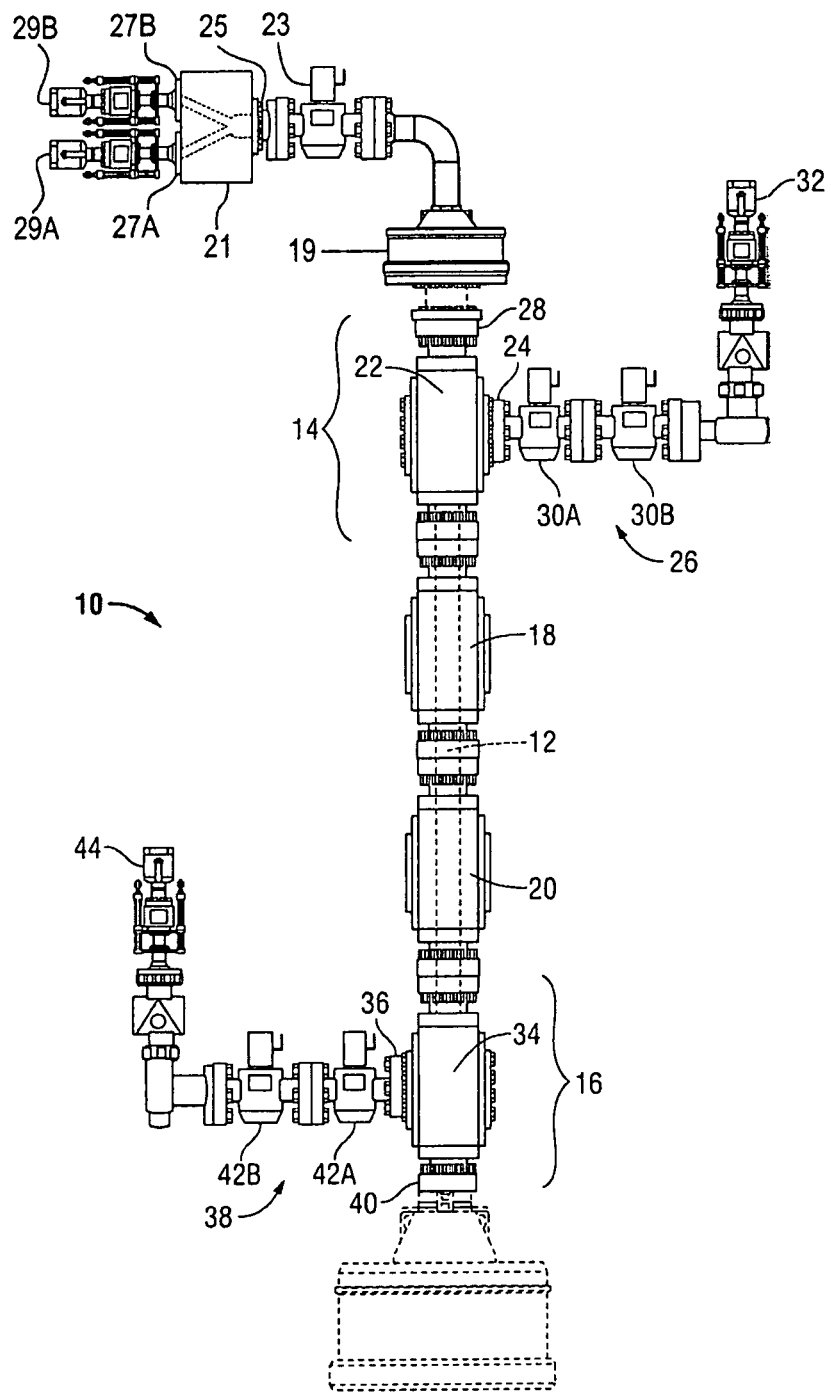
FIG. 5 depicts a diagrammatic side view of another embodiment of a system usable within the scope of the present disclosure.

The upper section (14) is shown having an upper connector assembly that includes a first flow cross member (22) (e.g., a 4 1/16" 10M flow cross), a first connector (24) that is shown engaged with a first pump in line (26) (e.g., a 2" 15M pump in line), and a top connector (28), that is usable for engagement with a blowout preventer, a chemical stimulation apparatus, and/or other apparatuses for performing well intervention operations (an exemplar of which is depicted in FIG. 5). The first pump in line (26) is shown including two barrier valves (30A, 30B), and an emergency quick disconnect connector (32) (e.g., a 2" EQD connector) usable for engagement with a chemical stimulation unit, a tree running tool, and/or with other devices for performing intervention operations (not shown). The emergency quick disconnect connector (32) can be used for rapid disengagement from the system (10) when it is desirable to quickly isolate the system (10) and/or to move an apparatus or vehicle away from the system (10).

The lower section (16) is shown having a lower connector assembly that includes a second flow cross member (34), having a second connector (36) that is shown engaged with a second pump in line (38), and a bottom connector (40), usable for engagement with a running tool, a wellbore conduit, or similar conduits and/or apparatuses (not shown). The second pump in line (38) is shown having two barrier valves (42A, 42B), and an emergency quick disconnect connector (44), usable for engagement with a chemical stimulation unit and/or to perform other intervention operations (not shown). The emergency quick disconnect connector (44) can also be used for rapid disengagement from the system (10) when it is desirable to quickly isolate the system (10) and/or move an apparatus or vehicle away from the system (10).

In use, a first operating and/or intervention apparatus and/or a chemical stimulation device can be engaged with the upper section (14) of the central conduit (12), above the flow control devices (18, 20), e.g., via the first flow cross member (22) and/or the top connector (28), while a second operating and/or intervention apparatus can be engaged with the lower section (16), e.g., via the second flow cross member (34). For example, a blowout preventer can be engaged to the top connector (28) while a chemical stimulation unit is engaged to the emergency quick disconnect connector (32) of the first pump in line (26), while a running tool is engaged to the bottom connector (40) and an additional chemical stimulation unit or other intervention apparatus is engaged to the emergency quick disconnect connector (44) of the second pump in line (38).

Chemical stimulation, and/or other intervention operations, can be performed through the flow control devices (18, 20) via the first flow cross member (22) (e.g., via the first pump in line (26) or first connector (24) and/or the top connector (28)).

Referring briefly to FIG. 5, one possible configuration usable for chemical stimulation is depicted including a Y-block (21) located above the top connector (28) via a modular receiver (19) attached to the top connector (28) and a modular connector (in this embodiment, acting as a cross connection) (25) connecting the Y-block (21) and the modular receiver (19) through a barrier valve (23) and elbow joint. The Y-block (21) is utilized for complex operations which require two fluid inputs to be pumped simultaneously and mixed in situ, as depicted by the dotted outline of (21) showing inputs (27A, 27B) leading into a mixing chamber.

The two inputs (27A, 27B) of Y-block (21) are each controlled by an independent emergency quick disconnect connector (29A, 29B) which controls the respective input to Y-block. It can be appreciated that the elbow connection is only one possible configuration usable for stimulation and not intended to be limiting; other embodiments may have straight connections or connections at shallower angles, or the inputs (27A, 27B) may be angled rather than the conduit between barrier valve (23) and modular receiver (19).

Additionally (e.g., simultaneously, sequentially, or alternatively), other intervention operations can be performed independent of the state of the flow control devices (18, 20) via engagement to the lower section (16) via the second flow cross member (34) (e.g., through the bottom connector (40) and/or the second connector (36) or second pump in line (38)). Further, the open bore extending throughout the depicted system (10) (e.g., from the top connector (28) through the flow control devices (18, 20) to the bottom connector (40)) enables wireline operations and similar interventions to be performed independent of other operations performed using the first and second connectors (24, 36) and/or associated pump in lines. As such, the depicted system (10) could be used to enable rapid performance of wireline operations to remove and/or actuate one or more plugs (e.g. through the top connector (28) and central bore of the system (10)), immediately prior to performing chemical stimulation operations through the first and/or second connectors (24, 36, respectively), without requiring substantial reconfiguration, removal, and/or replacement of components.

During use, the upper section (14) can be isolated from the lower section (16) and/or the wellbore below using the flow control devices (18, 20), and from the environment external to the system (10) via the barrier valves (30A, 30B) or similar devices. The lower section (16) can be isolated from the upper section (14) using the flow control devices (18, 20), and from the environment external to the system (10) using the flow control devices (18, 20) and/or the barrier valves (42A, 42B) or similar flow control devices.

Figure 2:
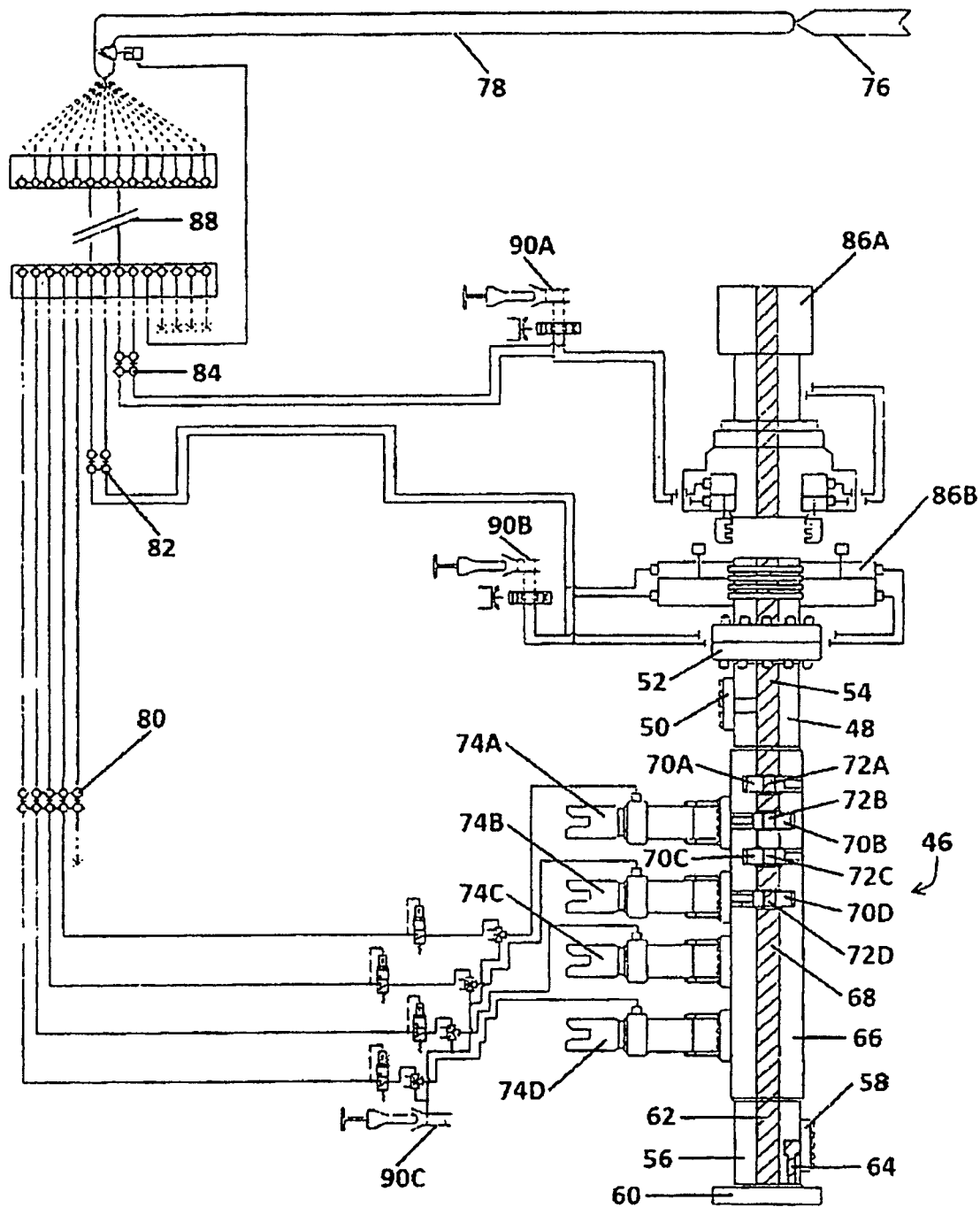
FIG. 2 depicts a diagrammatic side view of an alternate embodiment of a system usable within the scope of the present disclosure.

Referring now to FIG. 2, a diagrammatic side view of an embodiment of a system (46), usable within the scope of the present disclosure, is shown. The depicted system (46) includes an upper flow cross member (48) having a side connector (50) adapted for engagement with pump in lines and/or intervention apparatuses, a top connector (52) similarly adapted for engagement with lines and/or apparatuses, and a central bore (54) for accommodating fluid flow and/or passage of apparatuses and conduits (e.g., wireline). The system (46) is shown having a lower flow cross member (56), having a side connector (58) adapted for engagement with pump in lines and/or intervention apparatuses, and a bottom connector (60) adapted for engagement with a wellbore conduit, a running tool, or other similar apparatuses. The lower flow cross member (56) includes a central bore (62) in communication with the bottom connector (60) (e.g., for communication with wellbore tubing and/or casing), and a secondary bore (64) in communication with the side connector (58) (e.g., for communication with a wellbore annulus).

A conduit (66) is positioned between the upper and lower flow connectors (48, 56), the conduit (66) having a bore (68) that aligns with the bores (54, 62) of the flow connectors (48, 56) to form a continuous bore extending through the system (46), that can be accessible through the top connector (52), the bottom connector (60), and the side connector (50) of the upper flow cross member (48). Positioned within the conduit are four flow control devices (70A, 70B, 70C, 70D), which are depicted as hydraulic valves, each having a movable member with a throughbore (72A, 72B, 72C, 72D) extending therethrough. When in an open position, the throughbores (72A, 72B, 72C, 72D) are moved into alignment with the bore (68) of the conduit (66), while when in a closed position, the throughbores (72A, 72B, 72C, 72D) are moved out of alignment with the bore (68), such that the body of the valves blocks the flow of fluid through the bore (68). Each of the depicted flow control devices (70A, 70B, 70C, 70D) can be actuatable (e.g., in a linear direction) using corresponding actuators (74A, 74B, 74C, 74D), which can be powered by, e.g., a hydraulic supply (76) that communicates fluid through a control umbilical (78) or similar hydraulic conduit via a lower junction plate (80). Fluid can similarly be communicated through other junction plates, e.g., a middle junction plate (82) and an upper junction plate (84), to actuate additional components (86A, 86B), such as a blowout preventer and/or hydraulic connectors for securing thereto. The depicted system (46) is shown including independent hydraulic access points (90A, 90B, 90C) that can be independently accessed (e.g., by a remotely operable vehicle) to individually actuate and/or access the actuators (74A, 74B, 74C, 74D) or other components (86A, 86B). To provide a contingency for an uncontrolled scenario, a shear pin (88) can be provided to enable immediate disconnection of the hydraulic supply (76) from the system (46).

The depicted system (46) is thereby usable to perform chemical stimulation and/or other intervention operations through the top connector (52) or the side connector (50) of the upper flow cross member (48) to access the wellbore conduit, and through the side connector (58) of the lower flow cross member (56) to access the annulus. Due to the continuous inner bore extending through the system (46), wireline operations and/or the passage of tools and apparatuses therethrough are also possible, simultaneously with or sequentially following other operations performed via the side connectors (50, 58). Hydraulic access points (90A, 90B, 90C) can be usable to access the actuators (74A, 74B, 74C, 74D) and components (86A, 86B), as described previously.

Figure 3:
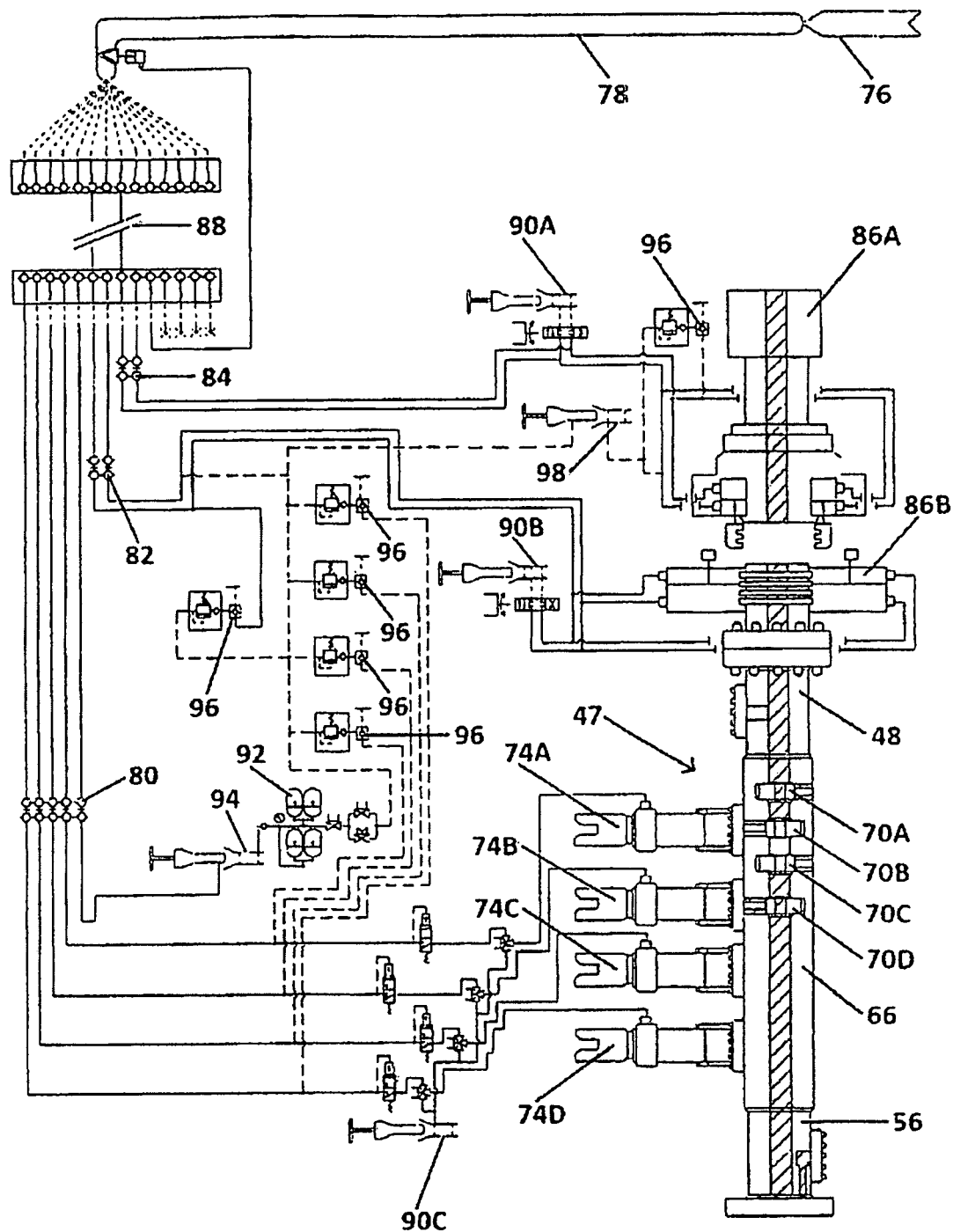
FIG. 3 depicts a diagrammatic side view of another embodiment of a system usable within the scope of the present disclosure.

Referring now to FIG. 3, a diagrammatic side view of an embodiment of a system (47), usable within the scope of the present disclosure, is shown. The depicted system (47) is substantially similar to that shown in FIG. 2, having flow cross members (48, 56) disposed on opposing ends of a conduit (66) having flow control devices (70A, 70B, 70C, 70D) therein, which can be actuated by actuators (74A, 74B, 74C, 74D). The actuators (74A, 74B, 74C, 74D) and associated wellbore components (86A, 86B) can be powered using hydraulic supply (76) via a control umbilical (78), which can flow hydraulic fluid via junction plates (80, 82, 84). The depicted system (47) is shown having a plurality of accumulators (92) in communication therewith, and further in communication with a series of vents (96). The accumulators (92) can be recharged via a hydraulic access point (94), and can be used to actuate a flexible jumper via an access point (98). In an emergent situation and/or in various other contingencies, the accumulators (92) can be used to actuate the flow control devices (70A, 70B, 70C, 70D), and/or to actuate or disconnect other system components.

Figure 4:
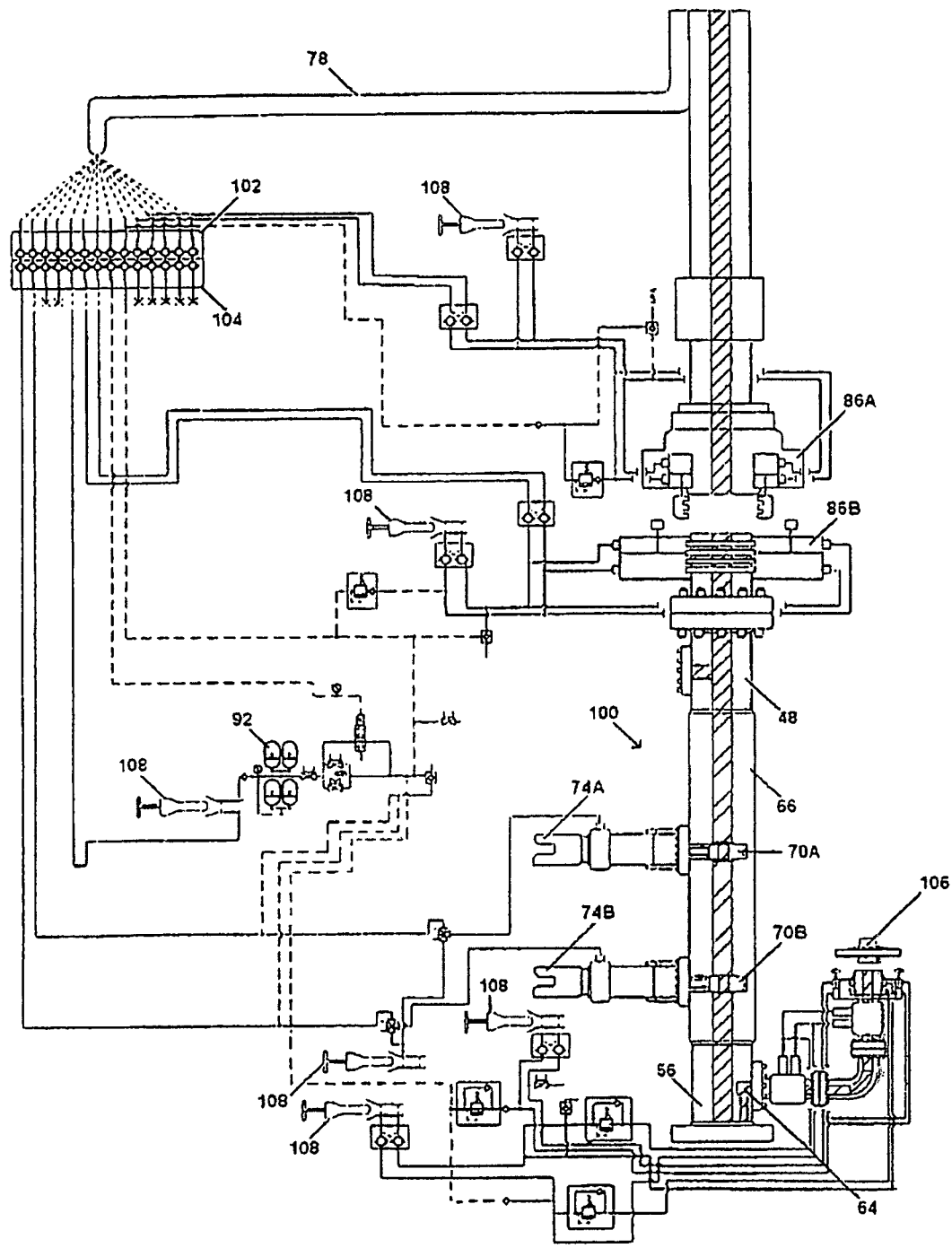
FIG. 4 depicts a diagrammatic side view of an additional embodiment of a system usable within the scope of the present disclosure.

Referring now to FIG. 4, a diagrammatic side view of an embodiment of a system (100) usable within the scope of the present disclosure is shown. The depicted system (100) is substantially similar to that shown in FIG. 3, having flow cross members (48, 56) disposed on opposing ends of a conduit (66) having flow control devices (70A, 70B) therein, which can be actuated by actuators (74A, 74B). The actuators (74A, 74B) and associated wellbore components (86A, 86B) can be powered using a hydraulic supply via a control umbilical (78), which can flow hydraulic fluid via conduits that engage quick disconnect plates (102, 104), which can be separated (e.g., via a shear pin) during an uncontrolled scenario. The depicted system (100) is shown having a plurality of accumulators (92) in communication therewith, which can be used to actuate the actuators (74A, 74B) and/or other components. An intervention tool (106) (e.g., a subsea tree or similar apparatus) is shown engaged with the lower flow cross member (56) for communicating with the secondary bore (64) therein. While the actuators (74A, 74B), wellbore components (86A, 86B), and/or the intervention tool (106) can be actuated using the control umbilical (78), or, if necessary, the accumulators (92). FIG. 4 also depicts a plurality of access points (108), through which one or more of the actuators (74A, 74B), wellbore components (86A, 86B), or the intervention tool (106) can be operated, and through which the accumulators (92) can be recharged, such as through use of a Remotely Operable Vehicle or similar means. The access points (108) are shown associated with various combinations of switches, vents, and/or valves.

Embodiments usable within the scope of the present disclosure thereby provide systems and methods that enable both well stimulation operations and other intervention operations (plug & abandonment, subsea remediation) to be conducted, simultaneously or sequentially, without requiring removal and/or replacement of equipment, while enabling portions of the system or the entire system to be isolated as needed. Additionally, embodiments usable within the scope of the present disclosure can be operated riglessly and/or using a minimum of equipment, eliminating the need for time consuming use of rigs, risers, and other conventional equipment and conduits.

While various embodiments usable within the scope of the present disclosure have been described with emphasis, it should be understood that within the scope of the appended claims, the present invention can be practiced other than as specifically described herein.

What is claimed is:

1. A system for performing operations on a well, the system comprising:
   a conduit having an upper section and a lower section;
   a first flow control device positioned between the upper section and the lower section;
   a second flow control device positioned beneath the first control device and between the upper section and the lower section; and
   an upper connector assembly engaged with the upper section, wherein the upper connector assembly comprises:
      an upper flow cross member in fluid communication with the first flow control device, wherein the upper flow cross member enables fluid flow in at least two directions;
      a side connector connected to a well intervention apparatus; and
      a top connector connected to a blowout preventer, a top well intervention apparatus, or combinations thereof,
   wherein the upper connector assembly enables simultaneous or combined operations performed using the blowout preventer, the well intervention apparatuses, or combinations thereof, and wherein at least one of the first flow control device or the second flow control device is actuatable using corresponding actuators powered by hydraulic fluid through the conduit via at least one junction plate.

2. The system of claim 1, further comprising:
   a lower connector assembly engaged with the lower section, wherein the lower connector assembly comprises:
      a lower flow cross member in fluid communication with the second flow control device, wherein the lower flow cross member enables fluid flow in at least two directions;
      a side connector adapted for connection to a well intervention apparatus; and
      a bottom connector adapted for engaging a running tool, a wellbore conduit, a blowout preventer, or combinations thereof.

3. The system of claim 2, wherein the upper side connector, the lower side connector, or combinations thereof, comprise an emergency quick disconnect connector.

4. The system of claim 2, further comprising a first pump in line engaged with the upper flow cross member, a second pump in line engaged with the lower flow cross member, or combinations thereof.

5. The system of claim 2, wherein the upper flow cross member comprises a first primary bore and a first additional bore fluidly connected with the first primary bore, wherein the lower flow cross member comprises a second primary bore and a second additional bore, and wherein the second additional bore is fluidly isolated from the second primary bore.

6. The system of claim 1, wherein the first flow control device, the second flow control device, or combinations thereof, comprise a ball valve, a hydraulic valve, or combinations thereof.

7. The system of claim 1, wherein the top well intervention apparatus comprises a Y-block, wherein the Y-block comprises at least two inputs and at least one output, and wherein the at least one output is connected to the upper connector assembly.

8. The system of claim 7, wherein the top well intervention apparatus further comprises at least two emergency quick disconnect connectors, operably connected to the at least two inputs.

9. The system of claim 7, wherein the at least one output of the Y-block is connected to the upper connector assembly at an angle.

10. The system of claim 7, wherein the Y-block further comprises a mixing chamber therein.

11. The system of claim 1, where the simultaneous or combined operations performed comprise well stimulation, well intervention, plug and abandonment, subsea remediation, or combinations thereof.

12. A system for performing operations on a well, the system comprising:
   a conduit having an upper section and a lower section;
   a first flow control device positioned between the upper section and the lower section;
   a second flow control device positioned beneath the first control device and between the upper section and the lower section;
   an upper connector assembly engaged with the upper section, wherein the upper connector assembly comprises a top connector connected to a blowout preventer, a top well intervention apparatus, or combinations thereof; and
   a lower connector assembly engaged with the lower section, wherein the lower connector assembly comprises:
      a bottom connector adapted for engaging a running tool, a wellbore conduit, a blowout preventer, or combinations thereof;
      a lower flow cross member in fluid communication with the second flow control device, wherein the lower flow cross member enables fluid flow in at least two directions; and
      a lower side connector adapted for connection to a well intervention apparatus,
   wherein the lower connector assembly enables simultaneous or combined operations performed using the blowout preventer, the well intervention apparatus, or combinations thereof, and wherein at least one of the first flow control device or the second flow control device is actuatable using corresponding actuators powered by hydraulic fluid through the conduit via at least one junction plate.

13. The system of claim 12, wherein the upper connector assembly further comprises:
   an upper flow cross member in fluid communication with the first flow control device, wherein the upper flow cross member enables fluid flow in at least two directions; and
   an upper side connector connected to a well intervention apparatus.

14. The system of claim 13, wherein the upper side connector, the lower side connector, or combinations thereof, comprise an emergency quick disconnect connector.

15. The system of claim 13, wherein the upper flow cross member comprises a first primary bore and a first additional bore fluidly connected with the first primary bore, wherein the lower flow cross member comprises a second primary bore and a second additional bore, and wherein the second additional bore is fluidly isolated from the second primary bore.

16. The system of claim 12, wherein the first flow control device, the second flow control device, or combinations thereof, comprise a ball valve, a hydraulic valve, or combinations thereof.

17. The system of claim 12, wherein the top well intervention apparatus comprises a Y-block, wherein the Y-block comprises at least two inputs and at least one output, and wherein the at least one output is connected to the upper connector assembly.

18. The system of claim 12, further comprising a third and fourth flow control device positioned between the upper section and lower section.

19. The system of claim 12, further comprising one or more accumulators capable of actuating the first flow control device, the second flow control device, or combinations thereof.

* * * * *